US008067996B2

(12) United States Patent
Hillman et al.

(10) Patent No.: US 8,067,996 B2
(45) Date of Patent: Nov. 29, 2011

(54) VANADIUM-DIOXIDE FRONT-END ADVANCED SHUTTER TECHNOLOGY

(75) Inventors: Christopher E. Hillman, Thousand Oaks, CA (US); Jeffrey F. De Natale, Thousand Oaks, CA (US); Jonathan B. Hacker, Thousand Oaks, CA (US); J. Aiden Higgins, Westlake Village, CA (US); Paul H. Kobrin, Newbury Park, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 569 days.

(21) Appl. No.: 12/291,874

(22) Filed: Nov. 14, 2008

(65) Prior Publication Data

US 2010/0123532 A1 May 20, 2010

(51) Int. Cl.

| | |
|---|---|
| ***H03G 11/04*** | (2006.01) |
| ***H01B 1/10*** | (2006.01) |
| ***H04B 1/18*** | (2006.01) |
| ***G01S 7/529*** | (2006.01) |

(52) U.S. Cl. ...... 333/17.1; 333/17.2; 333/262; 333/263; 455/217; 342/198

(58) Field of Classification Search ................ 333/17.1, 333/17.2, 262, 263; 455/217; 342/198
See application file for complete search history.

(56) References Cited

U.S. PATENT DOCUMENTS

| | | | | |
|---|---|---|---|---|
| 3,852,794 | A * | 12/1974 | Pearson et al. | 257/6 |
| 4,575,692 | A * | 3/1986 | Goldie | 333/13 |
| 4,752,778 | A * | 6/1988 | Simpson | 342/27 |
| 4,810,980 | A * | 3/1989 | Heston et al. | 333/17.2 |
| 5,878,334 | A * | 3/1999 | Talisa et al. | 455/217 |
| 7,642,881 | B1 * | 1/2010 | Robinson et al. | 333/104 |

OTHER PUBLICATIONS

P.J. Hood and J.F. De Natale, "Millimeter-wave dielectric properties of epitaxial vanadium dioxidethin films," *J. Appl. Phys.*, vol. 7, No. 1, pp. 376-381 (1991).

C.N. Berglund, "Thermal Filaments in Vanadium Dioxide," *IEEE Trans. on Elec. Dev.*, vol. ED-16, No. 5, pp. 432-437 (1969).

"Fast thin film vanadium dioxide microwave switches", E. Sovero, D. Deakin, J.A. Higgins, J. DeNatale, S. Pittman, Gallium Arsenide Integrated Circuit (GaAs IC) Symposium, 1990. Technical Digest Oct. 7-10, 1990, pp. 101-103.

.F. De Natale, P.J. Hood, and A.B. Harker, "Formation and characterization of grain-oriented $VO_2$ thin films," *J. Appl. Phys.*, vol. 66, No. 12, pp. 5844-5850 (1989).

(Continued)

*Primary Examiner* — Evan Pert
(74) *Attorney, Agent, or Firm* — Koppel, Patrick, Heybl & Philpott

(57) ABSTRACT

A vanadium dioxide front-end advanced shutter device. The electronic shutter device is designed to protect receiver front-ends and other sensitive circuits from HPM pulse events such as HPM weapons, directed energy weapons, or EMPs. The shutter incorporates a transition material such as thin-film vanadium oxide (VOX) materials that exhibit a dramatic change in resistivity as their temperature is varied over a narrow range near a known critical temperature. A high-energy pulse causes ohmic heating in the shutter device, resulting in a state change in the VOX material when the critical temperature is exceeded. During the state change the VOX material transitions from an insulating state (high resistance) to a reflective state (low resistance). In the insulating state, the shutter device transmits the majority of the signal. In the reflective state, most of the signal is reflected and prevented from passing into electronics on the output side of the shutter device.

45 Claims, 4 Drawing Sheets

OTHER PUBLICATIONS

Stotz S, Fritze S D, Downar H, Wegner J 1999 European Microwave Conference, 29th p. 415.

H.T. Kim, B.G. Chae, D.H. Youn, G. Kim, K.Y. Kang, S.J. Lee, K. Kim, and Y.S. Lim, "Raman study of electric-field-induced first-order metal-insulator transition in $VO_2$-based devices," *Appl. Phys. Lett.*, vol. 86, pp. 242101 (2005).

V.S. Vikhnin, S. Lysenko, A. Rua, F. Fernandez, and H. Liu, "The model of ultrafast light-induced insulator-metal phase transition in vanadium oxide," *Sec. Intl. Conf. on Photo-induce Phase Trans.*, pp. 44-49 (2005).

D. Kucharczyk and T. Niklewski, "Accurate X-ray determination of the lattice parameters and the thermal expansion coefficients of $VO_2$ near the transition temperature," *J. Appl. Cryst.* vol. 12, pp. 370 (1979).

Y. Ma, G. P. Li, "InGaP/GaAs HBT DC-20GHz Distributed Amplifier with Compact ESD Protection Circuits", in Proc. EOS/ESD Symp., 2004.

Y. Ma, "Low Loading Capacitance On-chip Electrostatic Discharges Protection Circuits for Gallium Arsenide Heterojunction Bipolar Transistor RFIC", Ph. D Dissertation, University of California, Irvine 2004.

Y. Ma, G. Li, "ESD Protection Design Consideration for InGaP/GaAs HBT RF Power Amplifiers", IEEE Trans on Microwave Theory and Techniques,vol. 54, No. 1, pp. 221-228, Jan. 2005.

"Recent Progress and Planned Future Directions in Gallium Nitride at TriQuint", Paul Saunier, Triquint Semiconductor, Panel Session Presentation, IMS2007 conference, Honolulu Hawaii, Jun. 2007.

C.N. Berglund and R.H. Walden, "A Thin-Film Inductance Using Thermal Filaments," *IEEE Trans. on Elec. Dev.*, vol. ED-17, No. 2, pp. 137-148 (1970).

J. Rozen, R. Lopez, R.F. Haglund, and L.C. Feldman, "Two-dimensional current percolation in nanocrystalline vanadium dioxide films," *Appl. Phys. Lett.*, vol. 88, pp. 081902 (2006).

K. Boutros, M. Regan, P. Rowell, D. Gotthold, R. Birkhahn, and B. Brar. International Electron Devices Meeting, 2003 Technical Digest. pp. 12.5.1-12.5.2.

K.S. Boutros, W.B. Luo, Y. Ma, G. Nagy, J. Hacker, IEEE J. Compound Semiconductor Integrated Circuit Symposium, Nov. 2006 pp. 93-95.

* cited by examiner

FIG. 1
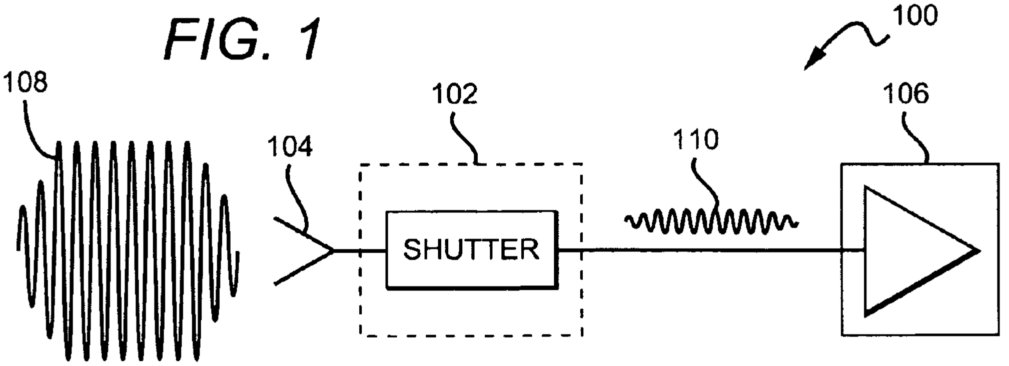
FIG. 2
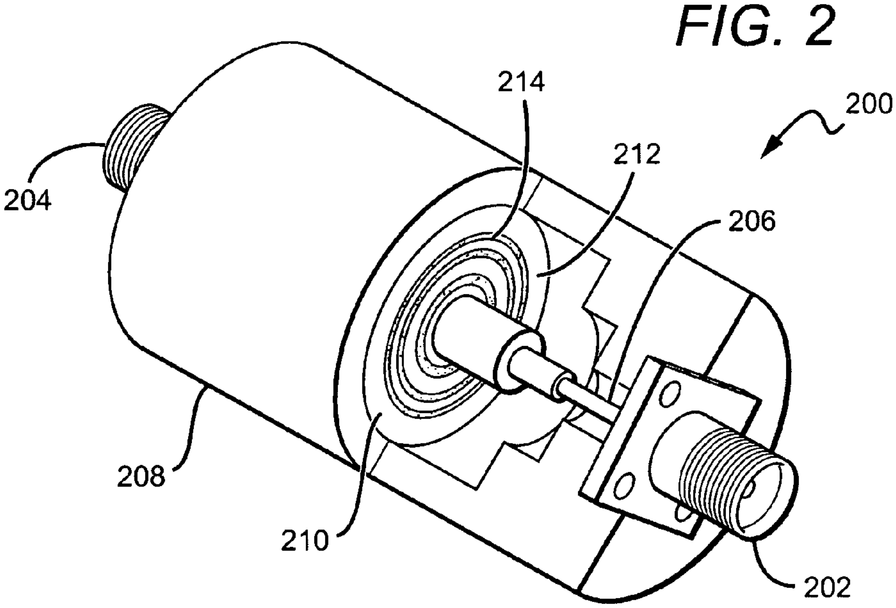
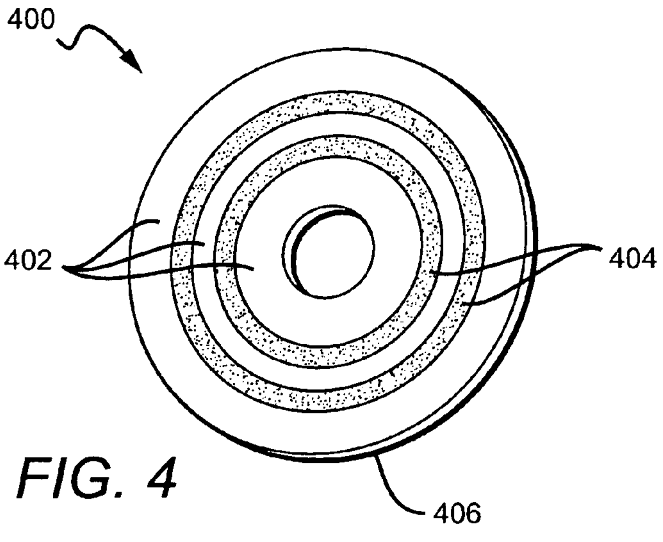
FIG. 4

FIG. 5a
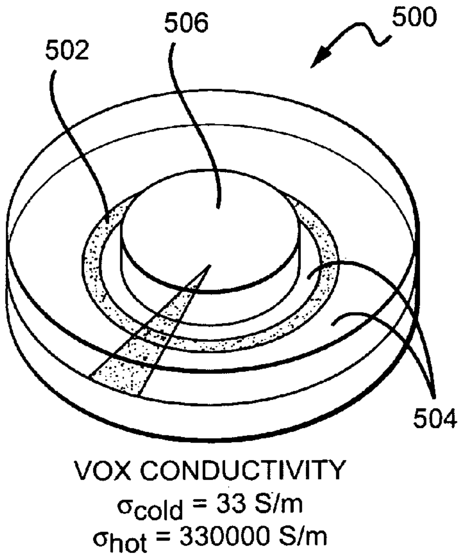
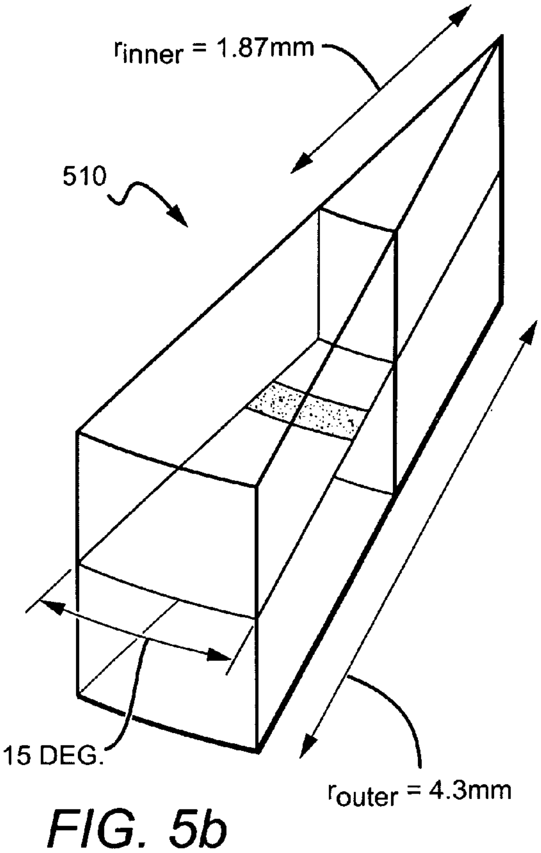
FIG. 5b
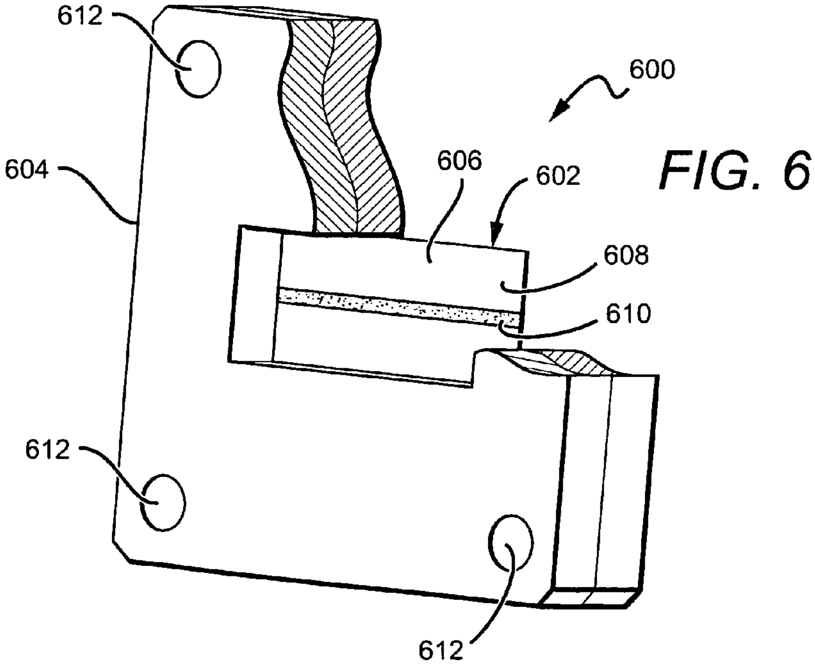
FIG. 6

VANADIUM-DIOXIDE FRONT-END ADVANCED SHUTTER TECHNOLOGY

BACKGROUND OF THE INVENTION

1. Field of the Invention

The invention relates generally to microwave systems and, more particularly, to high-speed front-end shutter components.

2. Description of the Related Art

Microwave systems have become increasingly important to electronic systems in many different fields, including defense applications. Modern military platforms are highly dependent on microwave systems for their on-board communications, radar and electronic warfare systems. The ability to protect these systems from high energy threats, such as high power microwave (HPM) weapons, directed energy weapons, or electromagnetic pulses (EMPs) that arise from nuclear blasts, is paramount to the effectiveness of the military.

Microwave receiver front-ends typically include a high-sensitivity low-noise amplifier (LNA) which is particularly vulnerable to high energy exposure. Receiver front-ends are, by functional necessity, well-coupled to electromagnetic energy from the environment via an antenna. As a result, the receiver front-end components (i.e. the entire RF to IF chain) are vulnerable to semiconductor junction breakdown, arcing, thermal damage and electromigration-induced damage that may accompany a high energy electromagnetic attack. Therefore, receiver front-end systems require power limiters to isolate the vulnerable components during a high power electromagnetic attack.

The current state of the art falls roughly into two categories; solid state diode limiters or plasma discharge limiters. Solid state emitter devices provide fast response (~1 ps); however they can only handle a maximum peak power of approximately 100 kW and typically handle only 10 W to 100 W over the duration of a 1 ms HPM attack. Plasma discharge tubes provide protection against significantly larger power levels but suffer from slower switching times. Present state of the art power limiters for microwave receiver front-ends do not sufficiently protect against the extraordinarily high electric fields generated by EMPs, HPM, or directed energy weapons. Hence, there is a need for a capable power limiter solution.

SUMMARY OF THE INVENTION

One embodiment of an electronic shutter device according to the present invention comprises the following elements. An input terminal is connected to receive an input signal. A thermally-activated electrical transition element is connected to accept said input signal and transmit an output signal. The transition element operates in an insulating state and transmits a substantial portion of the input signal when an operating temperature is below a critical temperature. The transition element functions in a reflective state and blocks a substantial portion of the input signal when the operating temperature of the transition element is at or above the critical temperature. An output terminal is connected to pass an output signal from the transition element.

One embodiment of a transmission line system according to the present invention comprises the following elements. A transmission line having an input terminal is connected to receive an input signal, and an output terminal is connected to pass an output signal. A thermally-activated shutter is disposed between the input and output terminals. The shutter operates in an insulating state and transmits a substantial portion of the input signal when an operating temperature is below a critical temperature. The shutter operates in a reflective state and reflects a substantial portion of said input signal when the operating temperature of the shutter is at or above the critical temperature.

One embodiment of a receiver system according to the present invention comprises the following elements. An antenna is disposed to receive an input signal. A receiver circuit processes the input signal and produces an output signal. The antenna is adapted to connect to the receiver circuit through a transmission line. A thermally-activated shutter is disposed in the transmission line between the antenna and the receiver circuit. The shutter operates in an insulating state and transmits a substantial portion of the input signal when an operating temperature is below a critical temperature. The shutter operates in a reflective state and reflects a substantial portion of the input signal when the operating temperature of the shutter is at or above the critical temperature. An output device is connected to manage information related to the output signal.

BRIEF DESCRIPTION OF THE DRAWINGS

FIG. 1 is a block diagram a receiver system including a shutter device according to an embodiment of the present invention.

FIG. 2 is perspective view of a shutter device according to one embodiment of the present invention.

FIG. 4 is a perspective view of a transition element according to an embodiment of the present invention.

FIG. 5 includes cross-sectional and pie-section views of a transition element according to an embodiment of the present invention.

FIG. 6 is a perspective view of a shutter device according to an embodiment of the present invention.

DETAILED DESCRIPTION OF THE INVENTION

Figure 3A:
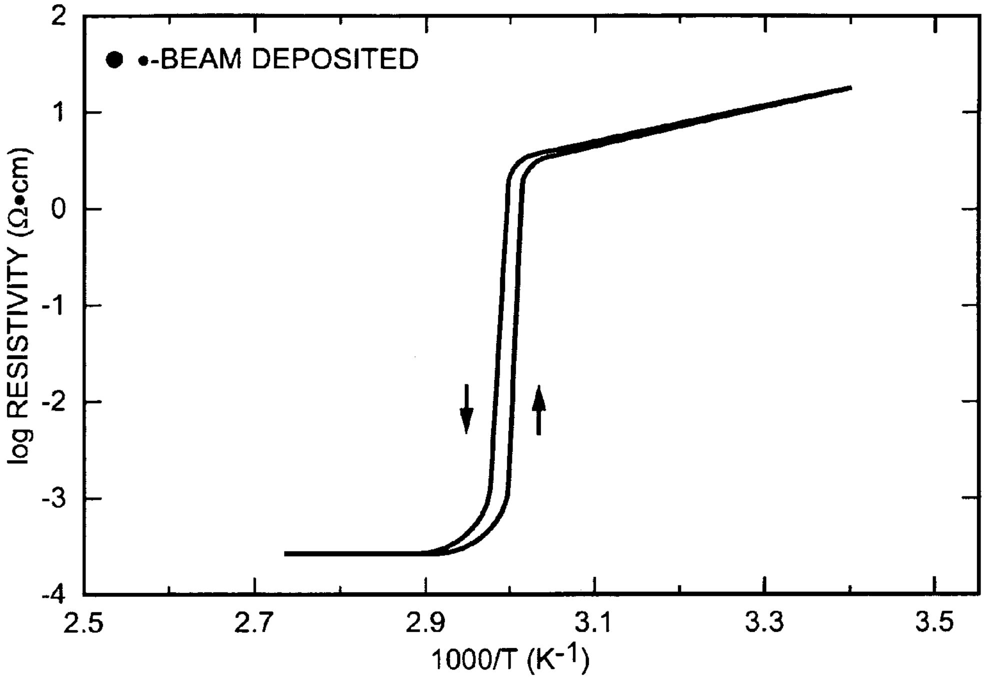
FIG. 3*a* and FIG. 3*b* are graphs modeling the electrical properties of a shutter device according to an embodiment of the present invention over a range of temperatures.

Embodiments of the present invention as disclosed in the claims provide an electronic shutter device designed to protect receiver front-ends and other sensitive circuits from HPM pulse events such as HPM weapons, directed energy weapons, or EMPs. The electronic shutter device incorporates thin-film vanadium oxide (VOX) materials that exhibit a change in resistivity of over four orders of magnitude as their temperature is varied over a narrow range near a known critical temperature. A high-energy pulse causes ohmic heating in the shutter device, resulting in a state change in the VOX material when the critical temperature is exceeded. During the state change the VOX material transitions from an insulating state (high resistance) to a reflective state (low resistance). In the insulating state, the shutter device transmits the majority of the signal. When the shutter device is operating in the reflective state, most of the signal is reflected and prevented from passing into the electronics on the output side of the shutter device.

Embodiments of the invention are described herein with reference to schematic illustrations of idealized embodiments of the invention. As such, variations from the shapes of the illustrations as a result, for example, of manufacturing and/or mounting techniques are expected. Embodiments of the invention should not be construed as limited to the particular shapes of the elements illustrated herein but are to include deviations in shapes that result, for example, from manufacturing. Thus, the elements illustrated in the figures are schematic in nature; their shapes are not intended to illustrate the precise shape of the element and are not intended to limit the scope of the invention. The elements are not drawn to scale relative to each other but, rather, are shown generally to convey spatial and functional relationships.

FIG. 1 illustrates a block diagram a receiver system 100 including a shutter device 102 according to an embodiment of the present invention. The shutter device 102 is connected between an antenna 104 and a receiver front-end 106. A high-power microwave pulse (HPM) 108 is incident on the antenna 104. An HPM event may be caused by HPM weapons, direct energy weapons, or electromagnetic pulses (EMPs) such as those generated by a nuclear blast. As discussed in more detail below, under normal operating conditions the shutter 102 functions in an insulating state, passing most of the signal that is incident on the antenna 104 to the receiver front-end 106. During an HPM event, the antenna 104 passes an extremely large signal 108 to the shutter device 102. This large signal 108 causes the shutter 102 to transition from the insulating state to a reflective state, and most of the large signal 108 is reflected, protecting the sensitive receiver front-end 106 electronics. Only a small portion 110 of the large signal 108 reaches the receiver front-end 106. Embodiments of shutter device 102 are capable of functioning across large bandwidths spanning from infrared (IR) to radio frequencies (RF) with particularly useful applications in the microwave range.

FIG. 2 depicts a shutter device 200 according to one embodiment of the present invention. A portion of the shutter device 200 is cut away to expose the elements on the inside of the device. This particular embodiment is designed to engage with a coaxial transmission line. The shutter device 200 has an input terminal 202 and an output terminal 204. A conductor 206 runs along the center axis of the device between the terminals 202, 204 inside a protective casing 208. A transition element 210 is disposed inside the casing 208 and surrounds a portion of the conductor 206. In this embodiment, the transition element 210 has an annular shape and is positioned perpendicular to the direction of electrical propagation along the conductor 206.

The annular embodiment of the transition element 210 is made of alternating concentric rings of a conductive material 212 and a transition material 214. The conductive material 212 can comprise any highly conductive material including metals such as gold, silver, platinum, or metal alloys. One group of materials that are known to have acceptable transition properties are oxides of vanadium (VOX), such as vanadium dioxide ($VO_2$) and vanadium sesquioxide ($V_2O_3$). Thin films of VOX may be photolithographically patterned on a substrate such as single-crystal sapphire, for example.

In one embodiment, the annular transition element 210 comprises alternating rings of gold (Au) as the conductive material 212 and thin film VOX as the transition material 214. A thin film (~500 nm) of VOX at temperatures below a critical temperature ($T_C$=67° C. for $VO_2$) exhibits insulating behavior. Electromagnetic energy incident on such a film suffers minimal attenuation. At temperatures above the critical temperature, the film behaves like a metal and the reflection coefficient approaches unity. Quality $VO_2$ films deposited on sapphire exhibit DC resistivity changes in excess of a factor of $10^4$ with values ranging from approximately 1 Ω·cm in the insulating state to $10^{-4}$ Ω·cm in the metallic state. One advantage provided by this material is found in using the lower conductivity of the cold insulating state to provide ohmic "self" heating of the film during an incident HPM pulse. With proper design, the ohmic heating can rapidly drive the film into its hot reflective state.

The temporal response of the shutter device 200 is described as follows. At the start of the HPM event, the normally insulating VOX transition element 210 is absorbing energy from the HPM via ohmic heating. Within approximately 10 ns, the VOX film undergoes an insulator to metal phase transition that activates the reflective state of the shutter 200, reflecting more than 99.9% of the incoming destructive pulse energy. The shutter 200 stays in this reflective state to provide isolation for the remaining duration (up to 1 ms) of the HPM attack. The provided isolation may exceed 60 dB. After the attack, the VOX film rapidly cools and transitions back to its normal insulating state, returning the shutter to its low-loss transmit mode. The thin film VOX can provide activation and recovery times of less than 10 ns and 100 μs, respectively.

Figure 3B:
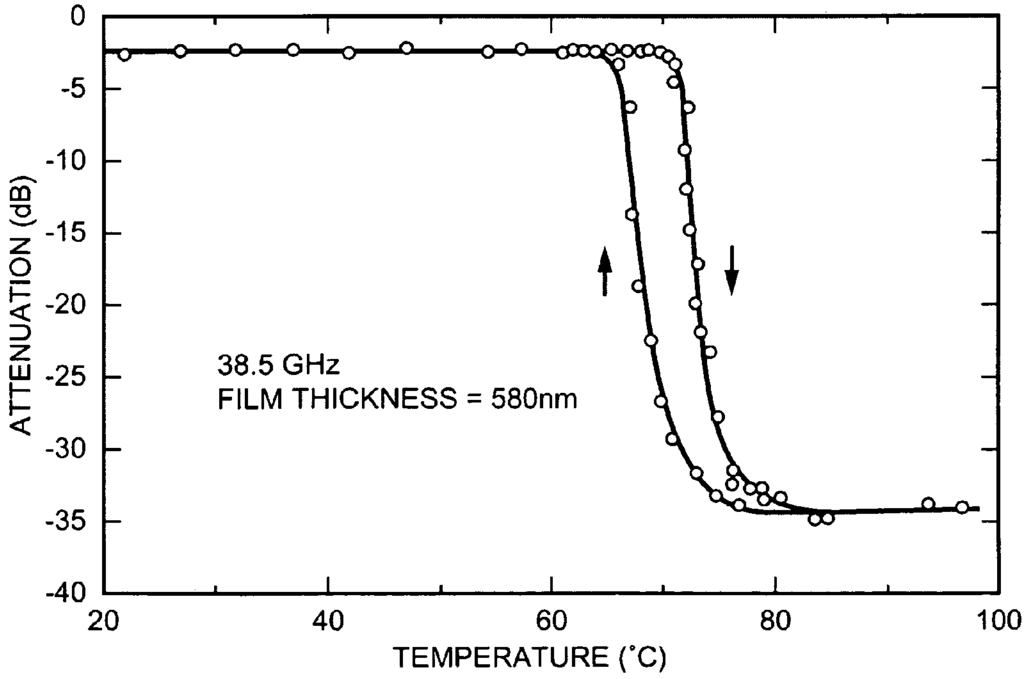

FIGS. 3*a* and 3*b* each show a graph modeling the electrical properties of a shutter device according to an embodiment of the present invention over a range of temperatures.

FIG. 3*a* shows the resistivity of the shutter device as a function of temperature. The horizontal axis represents a normalized inverse of temperature (1000/T, where T is in kelvin) such that temperature decreases in the positive direction (i.e., to the right of the origin). The vertical axis is the log of resistivity (log Ω·cm). FIG. 3*a* shows that as temperature increases (moving from right to left along the hysteresis loop) the resistivity gradually decreases until a critical temperature is reached. At the critical temperature, the resistivity decreases by close to four orders of magnitude along the path indicated by the down arrow. As the temperature of the shutter device decreases, the resistivity goes up dramatically at a temperature that is slightly lower than the critical temperature. The hysteresis of the system results in a slightly slower recovery time in the reflective-to-insulating state transition than in the opposite transition.

FIG. 3*b* is a graph of attenuation versus temperature of one embodiment of a shutter device according to the present invention. This graph models shutter having a $VO_2$ thin film with a thickness of 580 nm operating at a frequency of 38.5 GHz. The attenuation (dB) remains steady until the critical temperature is reached at around 67° C. At this temperature, the shutter 200 transitions from the insulating state to the reflective state, indicated by a sharp increase in signal attenuation (i.e., attenuation becomes more negative). Thus, the shutter 200 passes a very small portion of the signal at the input terminal 202 when the shutter 200 is operating in the reflective state. In the reverse direction, as the system cools to a temperature slightly lower than the critical temperature the shutter 200 transitions back from the reflective state to the insulating state and the majority of the signal is passed to the output terminal 204. An acceptable insertion loss for the shutter 200 is less than 3 dB while preferably providing a reflective state isolation of approximately 60 dB or better.

FIG. 4 shows a transition element 400 according an embodiment of the present invention. Similarly as the transition element 210, the transition element 400 has an annular shape and comprises alternating rings of conductive material 402 and transition material 404. The materials 402, 404 can be deposited on a substrate 406 which can then be shaped to fit within a particular shutter device design. The substrate 406 can be made of several materials with one acceptable material being single-crystal sapphire. The materials 402, 404 can be deposited on the substrate 406 using known methods, for example, photolithographic patterning. A hole 408 is disposed in the center of the transition element 400 to accommodate a cylindrical conductor (not shown). The transition element 400 is positioned around the conductor perpendicular to the direction of electrical propagation in the conductor. The conductor and the transition element 400 are in electrical and thermal contact to facilitate the heat-induced state change in the transition material 404. When the transition material is in the reflective state, an electrical short is created from the conductor to the outer bands of the transition element, pushing the coefficient of reflection to near unity.

FIG. 5*a* illustrates a cross section of a transition element 500 according to an embodiment of the present invention. The transition element 500 has an annular shape with alternating rings of transition material 502 and conductive material 504. A cross section of a conductor 506 running through the center of the transition element 500 is also shown. This particular embodiment comprises thin film VOX as the transition material 502 and a perfect electrical conductor (PEC) as the conductive material 504. The PEC material can comprise any highly conductive material including metals such as gold, silver, platinum, or metal alloys. The conductivity of the VOX is approximately 33 S/m in the cold insulating state and approximately 330,000 S/m in the hot reflective state.

FIG. 5*b* shows a wedge-shaped section 510 of the transition element 500 with some exemplary dimensions shown. In this particular embodiment, the annular transition element 500 has an outer radius of approximately 4.33 mm and an inner radius of approximately 1.87 mm. It is understood that other dimensions can readily be used to accommodate a particular shutter design.

FIG. 6 illustrates a shutter device 600 according to an embodiment of the present invention. This embodiment is particularly well-suited for use in a rectangular WR90 waveguide. However, it is understood that many other shapes are possible. The shutter device 600 has a membrane 602 bisecting a rectangular waveguide 604. The membrane 602 comprises a conductive material 606 such as gold deposited on a substrate 608 such as sapphire. The conductive material 606 has a narrow gap normal to the electric field orientation. The gap is bridged with a strip of transition material 610 such as VOX, for example. In the cold insulating state, the membrane 602 forms a capacitive iris. However, the capacitance in this embodiment should have a negligible effect on the waveguide 604 transmission properties. The single conductive strip has a height h. For a WR90 waveguide, an acceptable strip height is $h \approx 1$ mm. Other strip heights may also be used. Under normal operating conditions in the insulating state, the insertion loss of the shutter device 600 is approximately 2-4 dB. During an HPM event when the shutter device is operating in the reflective state, approximately 60 dB of isolation is provided. Guide holes 612 may be used to align the pieces of the waveguide 604 to allow for the easy insertion of the membrane 602.

Figure 7:
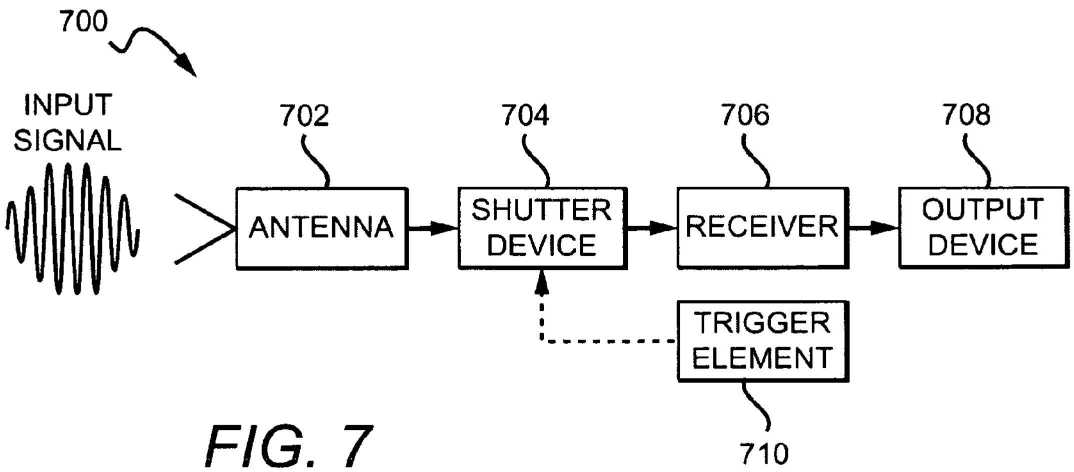
FIG. 7 is a block diagram of a receiver system according to an embodiment of the present invention.

FIG. 7 illustrates a receiver system 700 according to one embodiment of the present invention. An antenna 702 receives an incident signal. The antenna 702 passes the input signal to a shutter device 704 that functions as described in detail above. If the shutter device 704 is operating in the normal insulating state, the majority of the input signal is transmitted to a receiver 706. Thus, the insertion loss of the shutter device 704 is small to reduce signal attenuation in the insulating state. If the shutter device 704 is triggered, automatically or manually, it transitions to the reflective state via ohmic self-heating. In the reflective state a substantial portion of the input signal is reflected and prevented from reaching the sensitive electronics of the receiver 706. In the insulating state, the receiver passes the input signal to an output device 708. The output device 708 can comprise a visual device such as a computer monitor or screen for immediate analysis, or it can comprise a computer for storage and subsequent analysis. Other output devices may also be used.

In some embodiments, the receiver system 700 can comprise a trigger element 710. The trigger element 710 is used to manually trigger a state transition in the shutter device 704. Several different types of trigger elements can be used. For example, the trigger element 710 can comprise a laser. In such an embodiment, the laser may be turned on to quickly heat the shutter device 704 to the critical temperature to cause a state transition. The trigger element 710 can also comprise a circuit that sends a trigger signal to the shutter device 704 that causes the state transition. The trigger signal can be electrical, thermal, optical, or any other type of signal that can initiate a state change. Thus, the system 700 can operate in a passive mode where the state change is triggered only by the input signal, or the system 700 can operate in an active mode where the state change is initiated with a trigger signal. The active mode triggering scheme may be helpful if an HPM event is detected prior to reaching the antenna 702 or if such an event can be anticipated.

Figure 8:
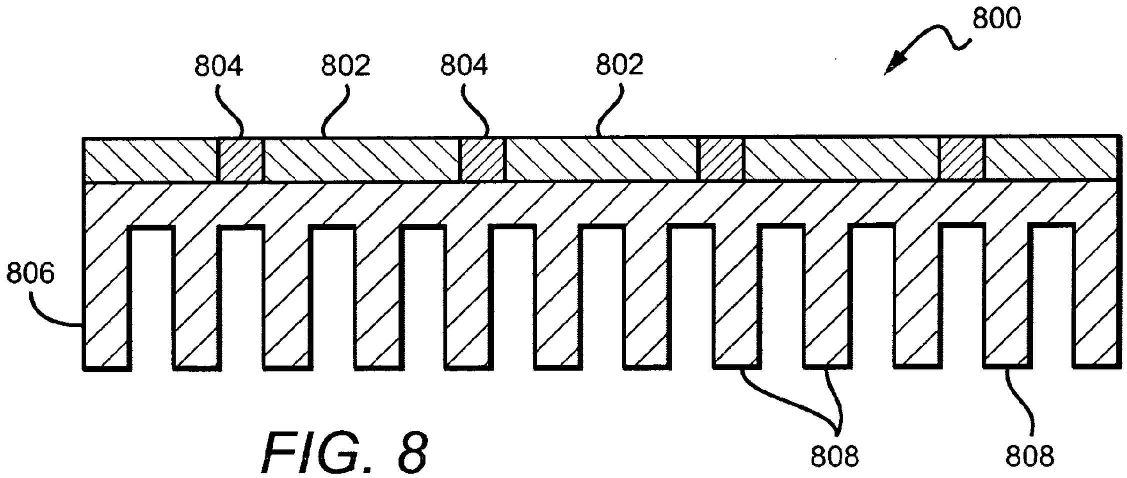
FIG. 8 is cross-sectional view of a transition element according to an embodiment of the present invention.

FIG. 8 shows a cross-sectional view of a transition element 800 according to an embodiment of the present invention. Similar to the embodiment shown in FIG. 4, conductive material 802 and transition material 804 have been deposited on a modified substrate 806 in a pattern of concentric rings. The substrate 806 has been modified using a subtractive process such as micromachining, for example. Portions of the substrate 806 have been removed to reduce the volume of material in the substrate 806. Such a structure may reduce the time it takes the transition element 800 to transition from the insulating state to the reflective state. More specifically, the reduced volume of material requires a smaller amount of energy to reach the critical temperature and trigger a state transition. The reverse transition from the reflective state back to the insulating state may exhibit a slower transition time as a result of the reduced volume of material; however, it is more important to have a faster transition time in the insulating-to-reflective transition than in the reflective-to-insulating transition.

Many known subtractive processes may be used to modify the substrate, including etching, grinding, and ablation. Other processes may also be used. The substrate 806 may be modified after the materials 802, 804 are deposited or prior to the deposition process. FIG. 8 shows one exemplary shape wherein concentric rings of substrate material have been removed from the side of the substrate opposite the deposited materials 802, 804 to define cutaway features 808. The term "cutaway" as used herein should not be construed to indicate that portions of a substrate were removed by mechanical cutting or any other particular subtractive method. The term is only meant to describe the substrate features that remain after the subtractive method has been applied. It is understood that many different modified substrate shapes are also possible.

Although the present invention has been described in detail with reference to certain preferred configurations thereof, other versions are possible. For example, the shutter device may be adapted for use in many different types of transmission systems. Examples of embodiments that work for coaxial and waveguide transmission lines have been provided; nonetheless, it is understood that the technology may be incorporated into almost any transmission line. Therefore, the spirit and scope of the invention should not be limited to the versions described above.

We claim:

1. An electronic shutter device, comprising:

an input terminal connected to receive an input signal;

a thermally-activated electrical transition element connected to accept said input signal and transmit an output signal, said transition element operating in an insulating state and transmitting a substantial portion of said input signal when an operating temperature is below a critical temperature, said transition element functioning in a reflective state and blocking a substantial portion of said input signal when said operating temperature of said transition element is at or above said critical temperature; and an output terminal connected to pass an output signal from said transition element.

2. The electronic shutter device of claim 1, said transition element comprising an oxide of vanadium (VOX).

3. The electronic shutter device of claim 1, said transition element comprising vanadium dioxide ($VO_2$).

4. The electronic shutter device of claim 1, said transition element comprising vanadium sesquioxide ($V_2O_3$).

5. The electronic shutter device of claim 1, said transition element comprising a combination of a conductive material and VOX.

6. The electronic shutter device of claim 5, said conductive material comprising gold (Au).

7. The electronic shutter device of claim 5, wherein said conductive material and VOX are disposed on a substrate.

8. The electronic shutter device of claim 7, said substrate comprising sapphire.

9. The electronic shutter device of claim 7, wherein portions of said substrate have been removed to define cutaway features.

10. The electronic shutter device of claim 1, wherein said transition element transitions between said insulating state and said reflective state in under approximately 10 ns.

11. The electronic shutter device of claim 1, wherein said transition element can operate in said reflective state for up to approximately 1 ms.

12. The electronic shutter device of claim 1, wherein said transition element is arranged around a coaxial conductor.

13. The electronic shutter device of claim 12, wherein said input and output terminals are adapted to connect to a coaxial transmission line.

14. The electronic shutter device of claim 12, said transition element comprising an annular membrane disposed perpendicular to the direction of propagation within said conductor.

15. The electronic shutter device of claim 14, said annular membrane comprising alternating rings of gold (Au) and VOX on a sapphire substrate.

16. The electronic shutter device of claim 1, wherein said transition element is arranged within a waveguide.

17. The electronic shutter device of claim 16, said transition element comprising a planar membrane disposed within said waveguide perpendicular to the direction of propagation.

18. The electronic shutter device of claim 17, said membrane comprising a strip of VOX interposed between two capacitive irises.

19. The electronic shutter device of claim 1, wherein said transition element is triggered by said input signal.

20. The electronic shutter device of claim 1, wherein said transition element is triggered by an external trigger signal.

21. The electronic shutter device of claim 1, wherein said transition element has a conductivity four orders of magnitude higher when operating in said reflective state than in said insulating state.

22. A transmission line system, comprising:

a transmission line having an input terminal connected to receive an input signal and an output terminal connected to pass an output signal; and a thermally-activated shutter disposed between said input and output terminals, said shutter operating in an insulating state and transmitting a substantial portion of said input signal when an operating temperature is below a critical temperature, said shutter operating in a reflective state and reflecting a substantial portion of said input signal when said operating temperature of said shutter is at or above said critical temperature.

23. The transmission line system of claim 22, said shutter comprising a transition element having a membrane disposed perpendicular to the direction of propagation of said transmission line.

24. The transmission line system of claim 23, said membrane having an annular shape formed by alternating rings of gold (Au) and an oxide of vanadium (VOX) on a sapphire substrate, said shutter arranged coaxially with said transmission line.

25. The transmission line system of claim 23, said membrane having a substantially rectangular shape with a strip of VOX interposed between two capacitive irises.

26. The transmission line system of claim 22, wherein said shutter transitions between said insulating state and said reflective state in under approximately 10 ns.

27. The transmission line system of claim 22, wherein said shutter can operate in said reflective state for up to 1 ms.

28. The transmission line system of claim 22, said transmission line comprising a coaxial cable.

29. The transmission line system of claim 22, said transmission line comprising a waveguide.

30. The transmission line system of claim 22, said transmission line comprising a ridged waveguide.

31. The transmission line system of claim 22, said transmission line comprising a circular waveguide.

32. The transmission line system of claim 22, wherein said shutter is trigger by said input signal.

33. The transmission line system of claim 22, wherein said shutter is triggered by an external trigger signal.

34. The transmission line system of claim 22, wherein said shutter has a conductivity four orders of magnitude higher when operating in said reflective state than in said insulating state.

35. A receiver system, comprising:

an antenna disposed to receive an input signal;

a receiver circuit for processing said input signal and producing an output signal, said antenna adapted to connect to said receiver circuit through a transmission line;

a thermally-activated shutter disposed in said transmission line between said antenna and said receiver circuit, said shutter operating in an insulating state and transmitting a substantial portion of said input signal when an operating temperature is below a critical temperature, said shutter operating in a reflective state and reflecting a substantial portion of said input signal when said operating temperature of said shutter is at or above said critical temperature; and an output device connected to manage information related to said output signal.

36. The receiver system of claim 35, said shutter comprising a transition element disposed perpendicular to the direction of propagation along said transmission line.

37. The receiver system of claim 36, said transition element comprising an annular membrane formed with alternating rings of a conductive material and an oxide of vanadium (VOX).

38. The receiver system of claim 36, said transition element comprising a rectangular membrane formed with a strip of VOX interposed between two capacitive irises.

39. The receiver system of claim 35, further comprising a casing that surrounds said shutter.

40. The receiver system of claim 39, said casing comprising a material with high thermal conductivity such that said casing provides a thermal path from said shutter to the ambient.

41. The receiver system of claim 35, further comprising a heating control element connected to regulate the temperature of said shutter.

42. The receiver system of claim 35, wherein said shutter operates in a passive mode such that said shutter transitions from said insulating state to said reflective state when triggered by said input signal.

43. The receiver system of claim 35, further comprising a trigger element connected to generate a control signal, wherein said shutter operates in an active mode such that said shutter transitions from said insulating state to said reflective state when triggered by said control signal.

44. The receiver system of claim 43, said trigger element comprising a laser.

45. The receiver system of claim 35, wherein said shutter has a conductivity four orders of magnitude higher when operating in said reflective state than in said insulating state.

* * * * *